(12) United States Patent
Chan et al.

(10) Patent No.: US 10,109,570 B2
(45) Date of Patent: Oct. 23, 2018

(54) RADIAL SOLDER BALL PATTERN FOR ATTACHING SEMICONDUCTOR AND MICROMECHANICAL CHIPS

(71) Applicant: Intel Corporation, Santa Clara, CA (US)

(72) Inventors: Eng Fook Chan, Gelugor (MY); Wei Chung Lee, Nibong Tebal (MY); Zhi Wei Low, Bukit Mertajam (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/271,765

(22) Filed: Sep. 21, 2016

(65) Prior Publication Data

US 2018/0082938 A1 Mar. 22, 2018

(51) Int. Cl.
| | |
|---|---|
| H01L 23/495 | (2006.01) |
| H01L 23/498 | (2006.01) |
| H01L 23/00 | (2006.01) |
| H01L 21/48 | (2006.01) |
| H05K 1/02 | (2006.01) |

(Continued)

(52) U.S. Cl.
CPC ...... *H01L 23/49838* (2013.01); *H01L 21/486* (2013.01); *H01L 21/4853* (2013.01); *H01L 23/49827* (2013.01); *H01L 24/16* (2013.01); *H01L 24/81* (2013.01); *H05K 1/0213* (2013.01); *H05K 1/115* (2013.01); *H05K 1/181* (2013.01); *H01L 2224/16235* (2013.01); *H01L 2224/8112* (2013.01); *H01L 2224/81815* (2013.01);

(Continued)

(58) Field of Classification Search
CPC . H01L 51/0072; H01L 51/56; H01L 51/0067; H01L 51/5012; C09K 11/06

USPC .......................................................... 257/668
See application file for complete search history.

(56) References Cited

U.S. PATENT DOCUMENTS

| | | | |
|---|---|---|---|
| 2005/0138592 A1 | 6/2005 | Morgan et al. | |
| 2009/0206493 A1 | 8/2009 | Pendse | |

(Continued)

FOREIGN PATENT DOCUMENTS

| | | |
|---|---|---|
| WO | WO-02-093647 | 11/2002 |
| WO | WO-2006-105015 | 10/2006 |

OTHER PUBLICATIONS

U.S. Appl. No. 14/970,290, filed Dec. 15, 2015, Chee Ling Wong, et al.

(Continued)

*Primary Examiner* — Andy Huynh
(74) *Attorney, Agent, or Firm* — Schwabe, Williamson & Wyatt P.C.

(57) ABSTRACT

A radial solder ball pattern is described for a printed circuit board and for a chip to be attached to the printed circuit board is described. In one example, the pattern comprises a central power connector area having a plurality of power connectors to provide power to an attached chip, a signal area having a plurality of signal connectors to communicate signals to the attached chip, an edge area surrounding the signal area and the central power connector area, and a plurality of traces each coupled to a signal connector, the traces extending from the respective coupled signal connector away from the central power connector to connect to an external component, wherein the signal connectors are placed in rows, the rows having a greater separation near the edge area than near the central area.

14 Claims, 9 Drawing Sheets

(51) Int. Cl.
*H05K 1/18* (2006.01)
*H05K 1/11* (2006.01)
(52) U.S. Cl.
CPC .............. *H01L 2924/1434* (2013.01); *H01L 2924/1461* (2013.01)

(56) References Cited

U.S. PATENT DOCUMENTS

| | | | |
|---|---|---|---|
| 2011/0179230 A1* | 7/2011 | Chou | G06F 9/3834 |
| | | | 711/147 |
| 2012/0007195 A1 | 1/2012 | Zhao | |
| 2015/0023684 A1* | 1/2015 | Kim | G03G 15/80 |
| | | | 399/90 |
| 2015/0124419 A1* | 5/2015 | Wong | H05K 1/112 |
| | | | 361/767 |

OTHER PUBLICATIONS

International Search Report and Written Opinion for International Patent Application No. PCT/US2017/047776 dated Nov. 27, 2017, 10 pgs.

* cited by examiner

RADIAL SOLDER BALL PATTERN FOR ATTACHING SEMICONDUCTOR AND MICROMECHANICAL CHIPS

FIELD

The present description is related to solder ball patterns for attaching chips to socket and system boards and, in particular, to a radial pattern.

BACKGROUND

Computing systems use a printed circuit board which is referred to as a system board, logic board, or motherboard to connect all of the components of the system together. The board can include connectors for external components, such as power supplies, mass memory and user interface devices, slots for memory and add-on cards, and holes to connect pins of chips and discrete components such as capacitors, and resistors. These parts of the board are adapted to suit the particular computing system. The chips to be attached will also vary with different computing systems. In some cases, chips are soldered directly to the board and, in other cases, a socket is soldered to the board and then a chip is clamped into the socket. This makes it easier to replace the chip. The board provides a solid structure for attaching parts and also uses copper traces to electrically connect parts and connectors to each other.

In chip manufacture, the chips are being made smaller and more complex. In general, this reduces cost and improves performance. The reduced size results in less surface area for external connections and the increased complexity results in more external connections that will be made. The connections are made by solder balls or pins on the exterior surface of the chip. At the same time, the printed circuit board imposes a technical limitation on the density of the connections to the chip. There is a limit to how near two connections on a printed circuit board may be and still be physically and electrically separate from each other. This limit depends on how the printed circuit board is made. A less expensive printed circuit board will require more distance between nearby connections. In most cases, the chip is able to support much higher connection density than the printed circuit board.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

As described herein, more connections may be made on a printed circuit board in the same space. This is presented herein as more routable I/O on a board, such as a type 3 4 layer (4L) motherboard without increasing the package form factor. The improvements are obtained by rearranging the package ball pattern in the middle span region to optimize the differential pair routing. This increases the routable I/O count on the motherboard.

Figure 1:
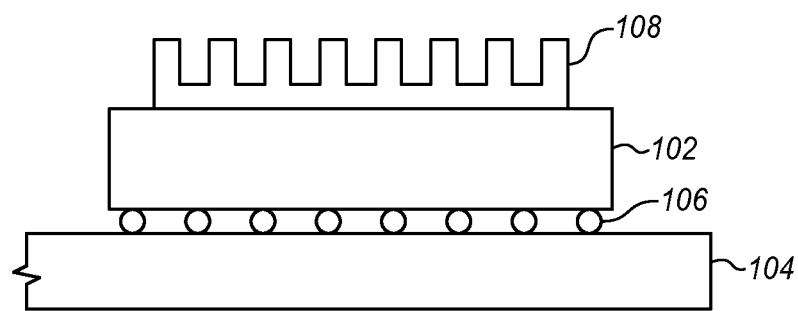
FIG. 1 is a side view diagram of a package attached to a printed circuit board according to an embodiment.

FIG. 1 is a side view diagram of a portion of a computing system. In this example a chip 102 is soldered 106 directly to a motherboard 104. The chip is shown as having a heat sink 108 on its back side and a solder ball array 106 on its front side attached to the motherboard. In surface mount technology (SMT), the chip and the motherboard both have matching arrays of lands. Solder balls are attached to the lands on the chip and the chip is placed on the motherboard. Both are heated, for example in a reflow furnace, to melt the solder and attach the chip to the board.

Figure 2:
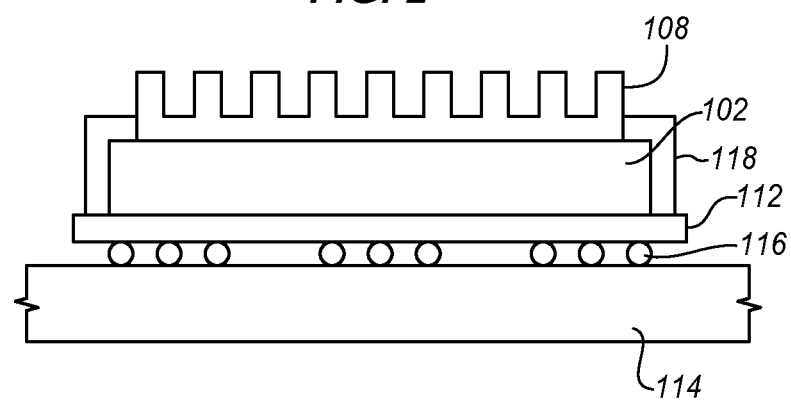
FIG. 2 is a side view diagram of a package attached to a socket that is attached to a printed circuit board according to an embodiment.

FIG. 2 is a side view diagram of a portion of an alternative computing system. In this example, the chip 102 is attached to a socket 112 by a clamp 118. The clamp is part of or attached to the socket. The socket is soldered 116 to the motherboard 114. The chip 102, including its heat sink 108, is clamped to the socket and held in place until the clamp is released.

The described embodiments may be applied to any of variety of different chips and is particularly well suited to chips with a high I/O count, such as central and graphics processors, signal processors, radios, and high density communications interfaces. The approach is also suitable for chips with a low I/O count and allows the I/O to be confined to a smaller area then otherwise might be possible. "Chip," as used herein refers, generally to one or more dies attached to a substrate, or package substrate. The dies may also be covered with a heat spreader, a plastic cover, a molded resin, or other protector. The dies may be stacked, placed side-by-side or embedded together in some way. The chip may also have passive components, antennas, and other components including additional connectors on the sides or top.

A conventional ball pattern for a printed circuit board is a grid. A fully gridded ball pattern has a regular array of rows and columns where the distance between each row and between each column is at least as large as the technical limit of the circuit board. A further constrain is that each of the balls in the pattern must be connected somewhere. A 4L board, for example has four wiring layers including the top layer. If a central ball is coupled to a component other than the chip, then there must be room for a copper trace to extend from that central ball to beyond the area of the chip without overlapping with another trace on the same layer.

Figure 3:
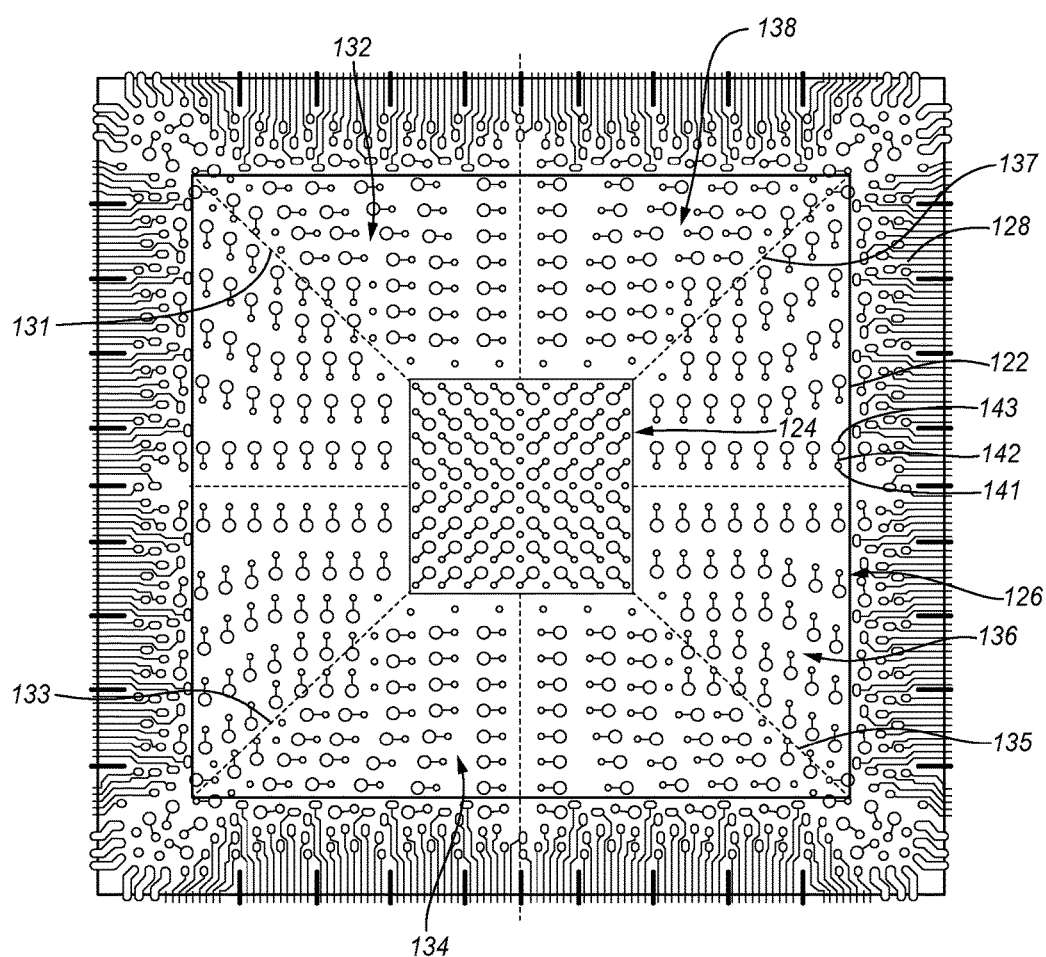
FIG. 3 is a diagram of a top plan view of a portion of a system board that includes lands or pads for attaching a chip or a chip socket according to an embodiment.

FIG. 3 is a diagram of a top plan view of a portion of a system board that includes lands or pads for attaching a chip or a chip socket. The particular attachment structure and technology may be adapted to suit any particular chip. Each land 141 is attached to a trace 142 which connects to a via 143 that connects that land to a trace on one of three copper wiring layers below the illustrated top surface. Alternatively, as shown in other figures, a land may attach to a trace that leads away from the attachment area on the top surface. The traces and vias require a minimum separation from each other trace and via. The minimum separate is determined by the structure and material of the board.

In some embodiments, the L4 board provides power on layer 2 (L2) and layer 3 (L3). The signaling traces are on layer 1 (L1) the top layer and layer 4 (L4) the lowest copper layer. However, the layers may be in other layers and there may be more or fewer layers to suit different computing devices. In the FIG. 3 example, a signaling trace may be either on the surface of L1 or connected from a pad through a via to L4. The L4 traces then connect through vias to reach other components.

The attachment area 122 has lands, pads, or balls in a pattern that has multiple areas. At the center is a middle span region 124. A package edge area 126 surrounds all of the other connectors. An outside area 128 is not part of the attachment area but is outside the area of the chip and has surface traces to connect the attachment points to other component and connectors (not shown). There may also be other traces (not shown) in copper layers below the illustrated top surface.

Between the middle span region 124 and the edge 128 is the primary span region 126, this is divided in this example into four primary span quadrants 132, 134, 136, 138. These quadrants have a novel radial star ball pattern which optimizes the balls and the vias through the board. For a 4L type 3 motherboard, the vias provide another space limitation to the I/O density. With this ball pattern, more I/O is able to be routed out from the primary span region compared to the rectangular grid pattern. Each quadrant may be seen as being split by a diagonal reference line 131, 133, 135, 137. This line may be used to determine ball positions, but is not a part of the structure nor are the horizontal and vertical lines that are used to define the four quadrants.

Figure 4:
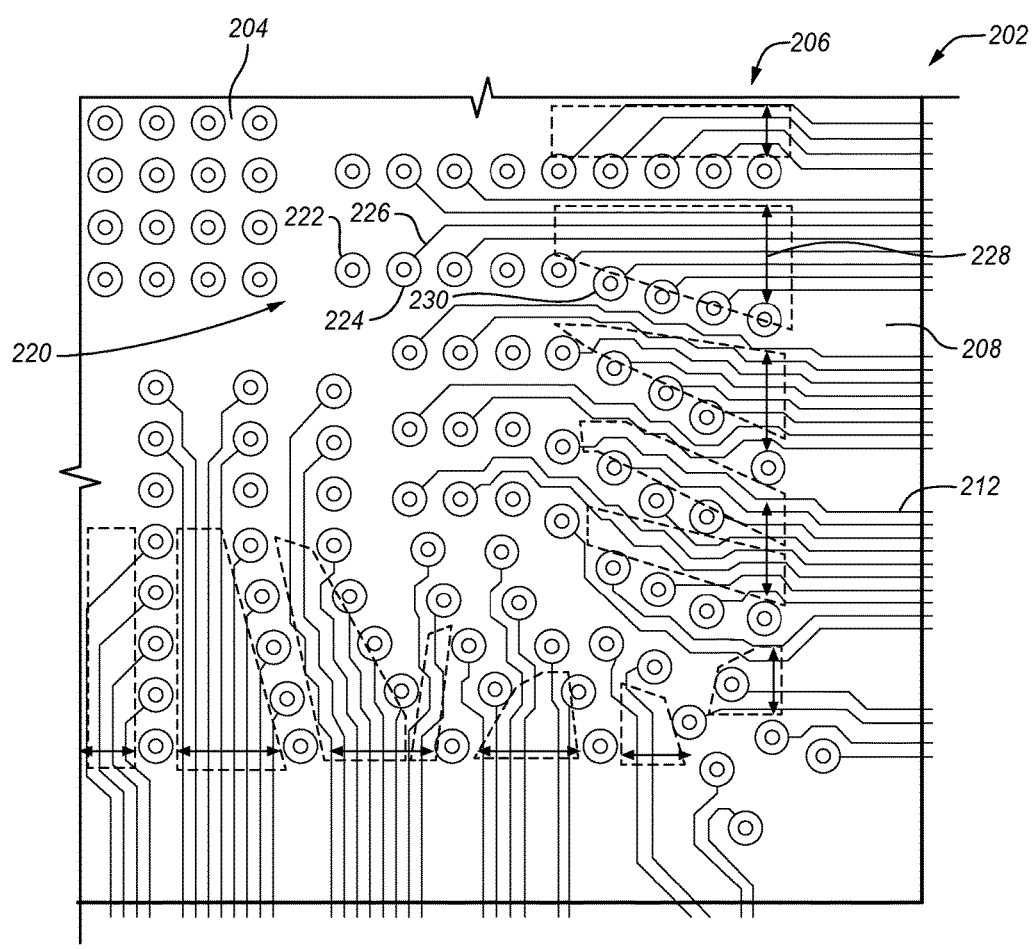
FIG. 4 is a bottom view diagram of a portion of the system board with an attachment area with a radial star via pattern according to an embodiment.

FIG. 4 is a bottom view diagram of a portion of the system board with an attachment area with a radial star via pattern. This view shows the L4 traces from contact vias that extend to the top surface shown in FIG. 3. The signal vias 143 of the top layer end at the vias shown here. The L4 layer is at the bottom and would be visible through a transparent dielectric bottom coating or if the bottom dielectric were not yet applied. The board 202 has middle span region 204 (shown for reference but not actually visible at L4), a primary span quadrant 206 on one side of the middle span region and an edge area 208 bounding the quadrant. The middle span region is shown as a simple grid pattern for simplicity. The edge area has traces 212 extending away from the quadrant to other components.

In the primary span quadrant 206, the signal connector vias are rearranged to give space for the better routing scheme described herein. The lands or solder balls of FIG. 1 are similarly rearranged. This better routing scheme may be used to reduce the cost of a chip package by allowing for more I/O pads on the same or a smaller chip. The lands may be considered as being in lines that approximate rows and columns but curve from a central location near the middle span region 204 out to the edge region 208. The lines curve radially outward from the center to form a star ball pattern. Viewed another way, the lines each show a regular or irregular divergence from the line that is placed before it.

Considering one of these lines 220, it has ground vias 222 as well as signal vias 224, 230. The ground vias may connect a land on the chip directly to power or ground without any connecting trace on this layer. The signal vias that are routed on this layer either connect to a via through a trace or connect to a longer breakout trace 226 that carries the signal from the land through a breakout space 228 indicated by the arrow past the edge area 208.

The breakout space is large enough to allow all of the breakout traces to pass through to the edge area. As shown with one of the lines of vias 220, the line is not strictly horizontal but curves downward away from the line above it to enlarge the breakout space 228. If the line 220 were horizontal, then there would be room for at most four traces in the breakout space. However the fourth via 230 from the center along the line is lower than the previous via or, in other words, it is spaced farther from the line directly above. This makes room for another trace to extend from the fourth via without interfering with the five traces that are already running to the edge area. The next via is moved still lower or farther from the line above to make room for yet another trace. Since all of the remaining vias in the line also have traces on L1 extending to the edge, each succeeding via is lower than the one on the middle side of the line. The line of vias 220 curves downward away from the line of vias above it so far that the breakout area 228 has room for eight traces instead of the four that otherwise might be accommodated.

Using this approach, after the first line or row, the next row diverges from the first row by an amount determined by the number of traces that are to be accommodated. When each via has a trace, then the row extends along a straight diagonal away from the row before it. When there is a ground via then the diagonal stops and the row extends along the row before it until another trace is added.

In this example, the width of each breakout area 228 is indicated by arrows. As shown there are narrower and wider breakout areas. Any I/O that is routed to another component through the board passes through the breakout area. Accordingly an increase in the total width of the breakout areas allows for more I/O routing. In a rectangular grid, the breakout areas are all the same size, however, in this example many of the breakout areas are larger than others. Dotted lines are used to show the area allocated to traces from near the center toward the edge of the attachment area near the breakout area. As shown, these trace areas are narrower in the center and then expand or widen as the sides approach the outer edge of the middle span regions. This increase in the width of the dotted line trace areas shows how the room available for traces is improved over a rectangular grid.

Figure 5:
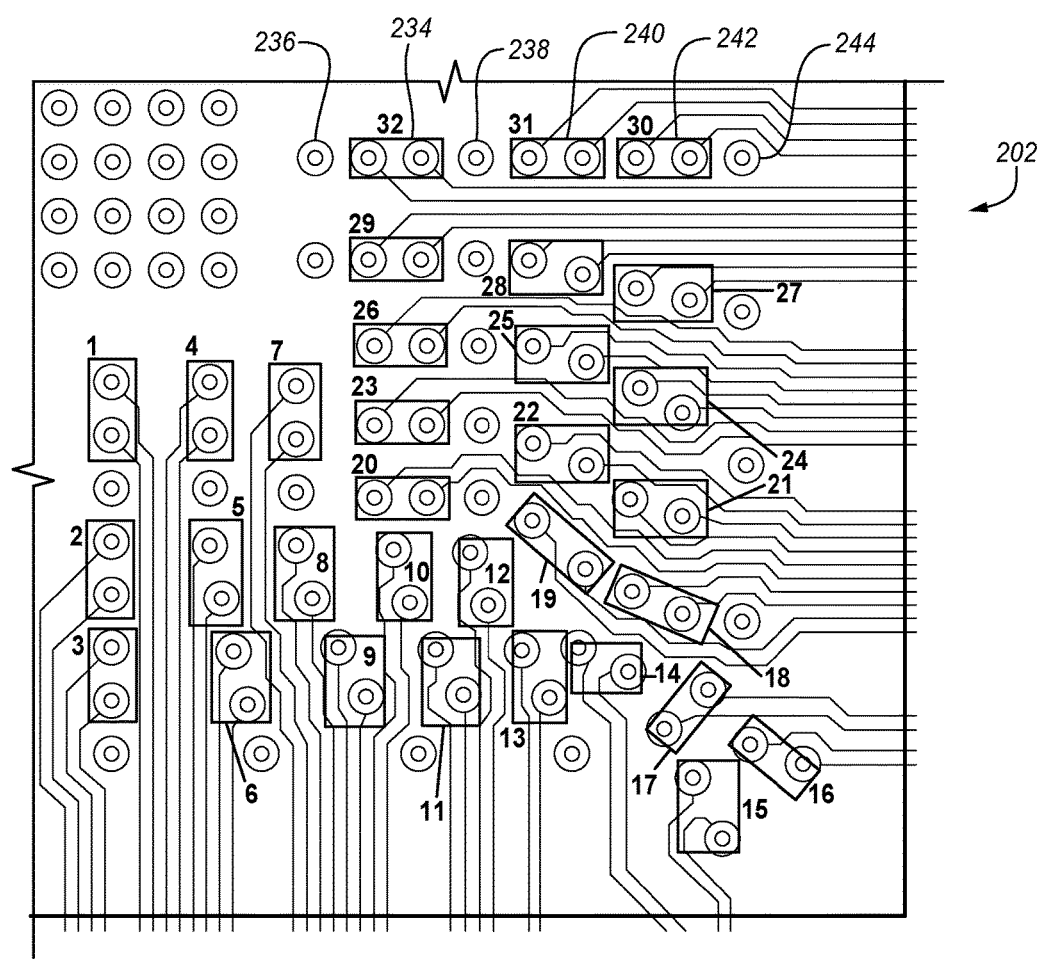
FIG. 5 is a bottom view diagram of the attachment area of FIG. 4 according to an embodiment.

FIG. 5 is a bottom view diagram of the attachment area of FIG. 4. In this diagram instead of highlighting the break out areas as in FIG. 4, differential pairs are highlighted using small boxes around each pair and labeled from 1 to 32. Much of the data for many chips is carried with differential signaling. For efficiency in the routing inside the chip, the two signal lines of a differential pair are next to each other. Referring to the row of vias at the top left of the diagram, the leftmost one 236 is a ground, the next two 234 to the right in box 32 are a differential pair, the next one 238 to the right is a ground, the next two pairs 240, 242 to the right in boxes 30, 31 are two more differential pairs and the left most ball 244 is a ground. This is an example of how the vias may be connected and how different rows may have different sequences of connections as shown. The order of connections between ground vias and differential pairs may be changed in each example to suit different implementations and different chip structures.

In this example, the middle span region is entirely or almost entirely power vias. These power vias are balanced by ground vias that are distributed through the quadrants. The power and ground vias are coupled to L2 and L3 as mentioned above and they may all be connected to each other so that individual traces are not required for each power via and for each ground via.

While it is useful and necessary to have ground vias, in a rectangular grid, the ground vias are used whenever there is not enough room for a trace to an external connection. The differential signal connections each require two traces that lead outward to make an external connection. When there is no room for two traces to extend past the edge area, then a ground via may be inserted. When there are too many ground vias, then the balls of the grid are wasted.

The reason for too many ground vias is that many balls are not able to connect to routing in 4L of the motherboard because of the narrow routing space. The radial star pattern has removed these wasted ground vias by increasing the breakout areas and adding more traces. By exchanging the gridded I/O ball pattern for the radial star ball pattern there is more I/O breakout area so that the diagonal wasted area in gridded ball pattern may be fully utilized. The limitations of via placement and signal breakout can be overcome by rearranging the gridded ball-to-ball pattern to create more room for signal breakout.

Figure 6:
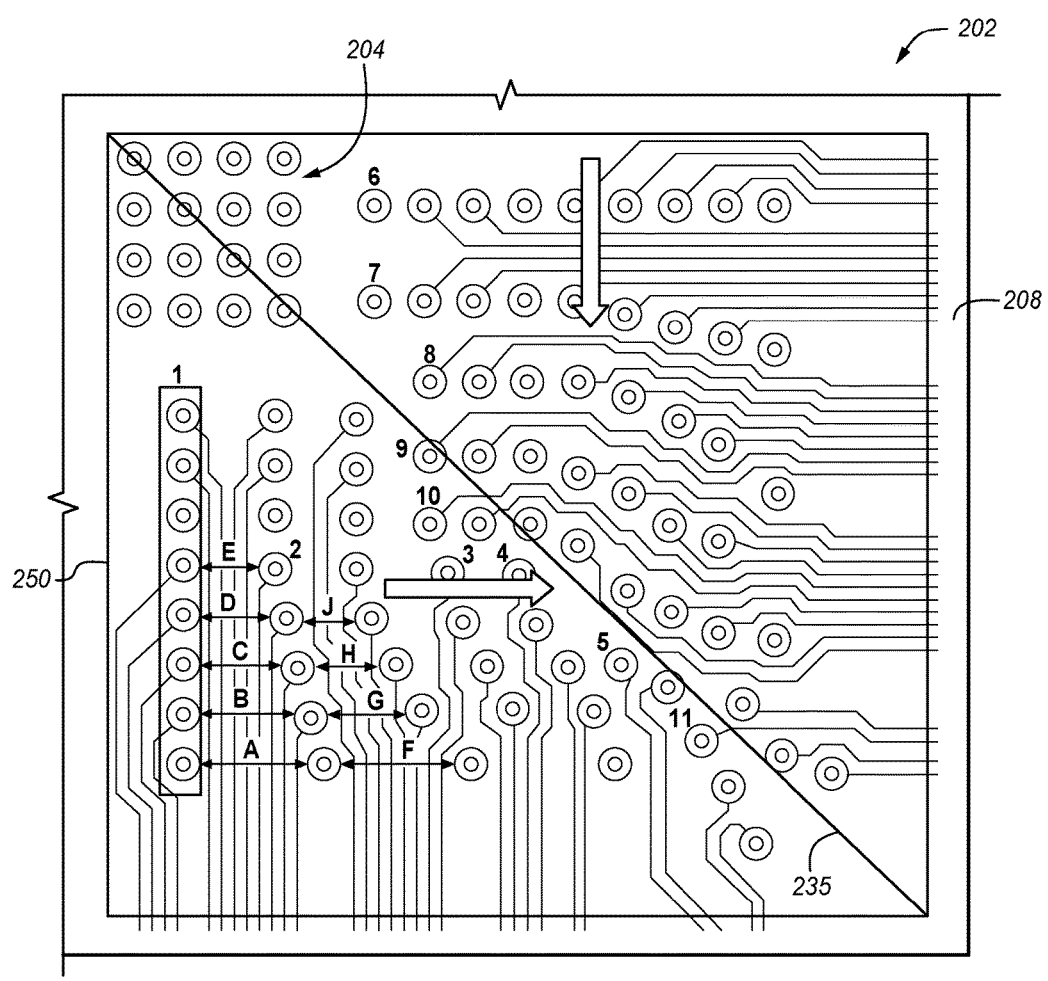
FIG. 6 is a bottom view diagram of the attachment area of FIG. 4 indicating how the radial star pattern may be defined according to an embodiment.

FIG. 6 is a bottom view diagram of the attachment area of FIG. 4 indicating how the radial star pattern may be defined. The placement of the balls in the pattern is subject to several restrictions. The printed circuit board structure and manufacturing technology require a minimum spacing between any two balls and also a minimum spacing between any two traces. This limit is determined in part by the structure of the board, the level of insulation provided by the board between two structures, the accuracy in placing holes and traces, the expected voltage and current of the signals, etc.

The specific shape and form of the rows in the radial star ball pattern may be determined in a variety of different ways. In the illustrated example, the placing of the rows may begin along the edge of the quadrant with a first row labeled as "1." Any other straight line of the quadrant may be used or a straight line may be established anywhere in the quadrant as a starting place. This first row is placed with an appropriate number of signal connectors. The number of connectors may be determined by the distance from the edge 208 to the central power area 204. Each power connector requires a certain distance from the next closest power connector. This minimum distance may be used to place the signal connectors along the row. In the illustrated example, there is room for 8 signal connectors.

The number of signal connectors may be determined by applying the size of each via connector (Csize) and the required spacing (Cspace) to the total available distance (Dt). This may be expressed in an equation that can be solved for n, the maximum allowable number of vias. In the illustrated example, n=8 for row 1.

$$nCsize+(n-1)Cspace=Dt \qquad (Eq. 1)$$

Having established and set a starting row of vias aligned straight with the quadrant edge, the signal breakout may be determined. As with the vias there is a minimum spacing necessary for the traces. This spacing is function of the substrate layer technology and the anticipated signal voltage and current. The space required for a trace is the width of the trace plus the minimum spacing between traces. In practice, with the first row set, then the vias will be assigned and the traces routed.

As explained above, for differential signaling adjacent vias may be assigned to opposing sides of a differential pair. In addition some vias are assigned to be ground vias. The ground vias are best distributed through the row. In the first example of 8 vias, there are three differential pairs and two ground vias. The particular position of each ground via may be adapted to suit different implementations. The traces are then routed. In this case, vias for two pairs are routed on the left side of the row closest to the quadrant edge and one pair is routed on the right side of the row.

Adding up the trace spacing then determines the position for the nearest vias of the next rows. This relationship may also be expressed as a formula in which the trace size or width (Tsize) plus the minimum spacing between traces (Tspace) is combined with the minimum space between a trace and via (TVspace) for the via at either end.

$$nTsize+(n-1)Tspace+2TVspace=\text{Via to Via Spacing} \qquad (Eq. 2)$$

In this example the next row 2 may be started for simplicity at a standard distance which, in this case, is sufficient for four traces. The top via is placed at that distance from the top via of the next row. It has a breakout trace alongside the two breakout traces of the first row, row 1. The second via may be placed at the same distance from the second via of row 1. The second via also has a breakout trace. This makes for 4 traces, the maximum number allowed by the spacing indicated as E. The third via is a ground that has no trace. The fourth via is a signal via and has a breakout trace. Because the traces are smaller than the vias, the fourth via's trace may be directed along the other four traces without moving the via. From vias one to four the row is a straight line. The fifth and next via must allow room for 5 traces because of the trace from the fourth via. As a result the spacing between row 1 and row 2 is increased at the fifth via. This spacing is indicated as D.

The next two vias are also signal vias and add two more traces to the total number of traces to be accommodated in the same breakout area. With each additional via, spacing between the rows is further increased by moving the next via of row 2 farther from row 1 than the via above it. The spacing for the sixth via, indicated as C accommodates 6 traces. The next via is still farther from row 1 at a distance B for 7 traces and the last via is at distance A for 8 traces. This increasing distance creates an angular diversion from the direction of row 1.

This process continues with mapping each row until hitting the 45 degree diagonal quadrant line 235. The area is configured from a quadrant divider 250 to the diagonal quadrant line 235. However, the area may be configured in another order. While the diagonal is shown as being a 45 degree line, the diagonal quadrant line may be at any other angle, such as 30, 60, or some other number of degrees. Any other way of dividing the main span area 126 may be used instead of straight and diagonal lines. In addition, the rows may be mapped in the opposite order starting at the diagonal and progressing back to the rectangular line. For the next row, row 3, the first via is placed at this same distance. The first two vias are differential signal vias and the traces extend from the vias to the breakout area at the edge area 208. However, because of the shift of the vias in row 2, the breakout traces do not proceed in a straight line to the edge but veer to the right to avoid the shifted vias of row 2.

As shown in row 3, the fifth via from the top is shifted left to keep a spacing J for 3 traces. This is caused by the fifth via in row 2 being shifted to keep a spacing for 5 traces. Since the vias of row 2 each shift to accommodate one more trace, the vias of row 3 each shift to accommodate 2 traces, the added trace of row 2 and an added trace from row 3. Specifically via 6 is shifted to create a spacing H for 4 traces. Via 7 is shifted to create a spacing G for 5 traces. Via 8 is shifted to create a spacing F for 8 traces. The 8 traces include one from row 3 and two from row 4. This creates a curve in row 3 away from row 2.

Row 4 shows an additional constraint. In this example, the diagonal quadrant edge is used as a boundary for placing the vias. The diagonal quadrant line 235 then limits the placing of the top via of row 4. The top via of row 4 is placed below the diagonal quadrant line and with the 4 trace spacing from row 3 as was used with first three rows. The same spacing principles are then used to plot the vias of row 4. Due to the lower start caused by the quadrant, there is room for only 5 vias in this row. The last via however, is not used to leave space for breakout traces. The next row has 5 vias and the last row also has five vias. The traces however are allowed to extend through rows in order to reduce the length and total space used.

After the lower half of the quadrant rows are plotted, then the population is restarted from the opposite quadrant edge with row 6. This row at the opposite quadrant edge again follows the edge and is straight. It is the same as row 1 except that the positions of the ground vias and signal vias are changed. Rows 7 and 8 are also the same as rows 1 and 2, respectively except for the placement of the ground vias. This is not necessary but is likely if the same rules are followed for placing the first via of the row and for spacing.

Row 9 is different from row 3 or 4 because it is using a different rule. The same is true for rows 10 and 11. For these rows, the diagonal quadrant edge is violated. Because the first set of rows did not use all of the available space in the first part of the quadrant. These rows place the first via across the quadrant line to use the space that otherwise is not occupied. The same spacing rules apply.

There is one further constraint shown in this example, and that is that the ground vias are placed in straight lines perpendicular to the rows. This simplifies the routing of the ground layers at L2 or L3. The placement of the ground vias affects the traces at L4 because the ground vias do not have traces at L4.

The use of an interconnect area can be characterized by considering the number of differential signal vias in a particular area. The quadrant shown in FIG. 6 has 64 signal vias to support 32 differential pairs. The standard gridded pattern supports only 26 pairs because signal traces cannot reach all of the possible via locations of the grid. As mentioned above, these via locations with no trace are used for ground vias. The described pattern has better Second Level Interconnect (SLI) density by over 7%. For all four quadrants there are 24 more signal pairs supported in the same package form factor. Looked at another way, to support the same number of signal pairs with a gridded or with any of many other types of patterns, a larger package would be required. A larger package with a larger I/O area is more expensive and may also necessitate a larger product form factor.

Figure 7:
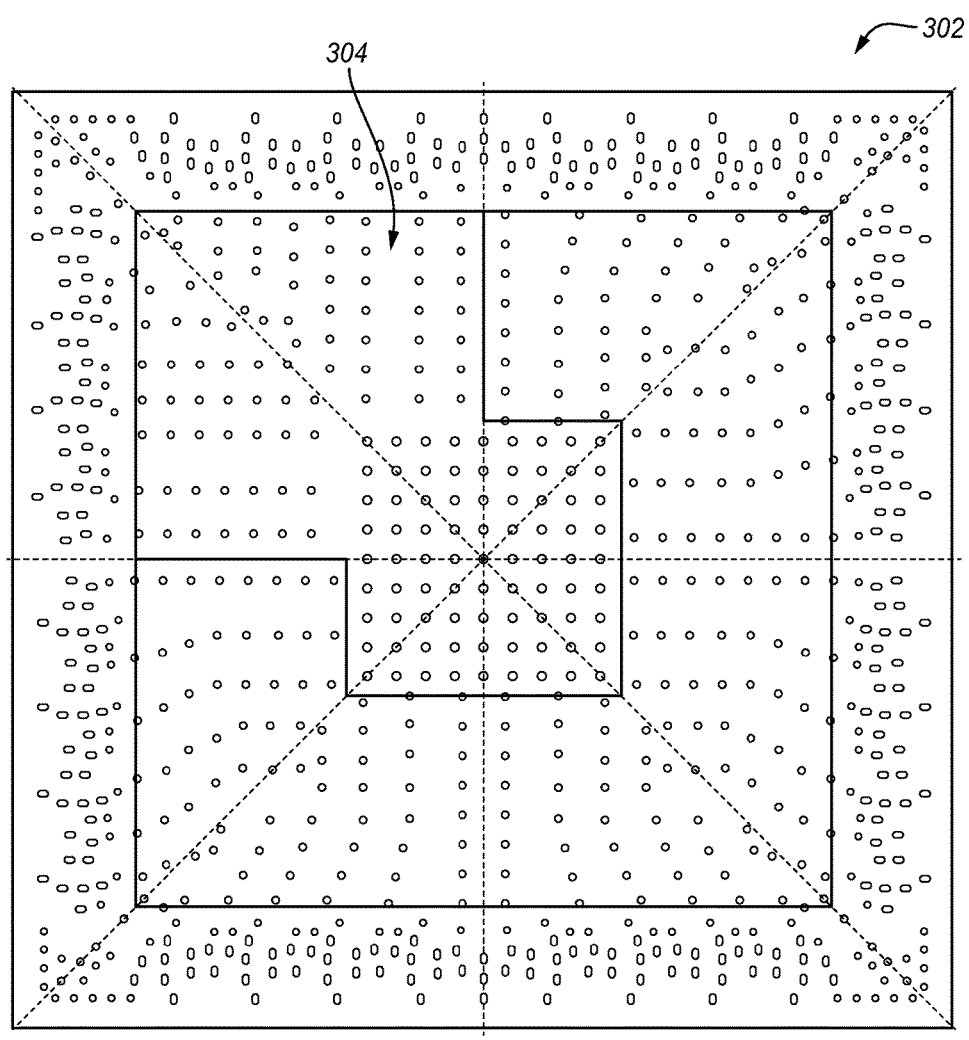
FIG. 7 is a diagram of a top view of a chip attachment area in which three of four quadrants have a radial star ball pattern according to an embodiment.

In the diagram of FIG. 3, all four quadrants 132, 134, 135, 136 use the radial star pattern, however, this is not necessary. FIG. 7 is a diagram of a top view of a chip attachment area 302 similar to that of FIG. 3 in which one of the four quadrants 304 has a rectangular grid pattern. The other three quadrants use the radial star pattern.

Figure 8:
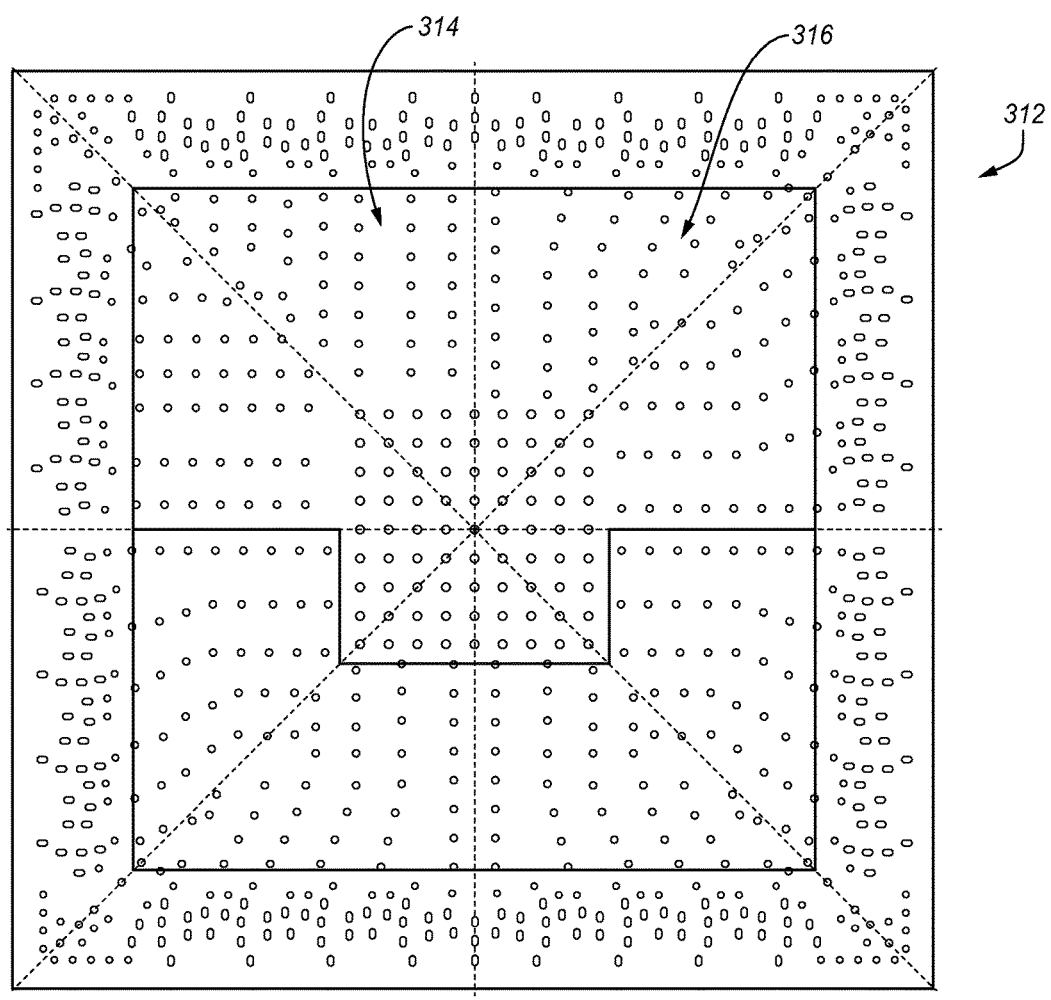
FIG. 8 is a diagram of a top view of a chip attachment area in which two of four quadrants have a radial star ball pattern according to an embodiment.

Similarly in FIG. 8 a chip attachment area 312 has two quadrants 314, 316 with a gridded pattern. While these quadrants are shown as being adjacent they may opposite each other so that a radial star pattern is between them.

Figure 9:
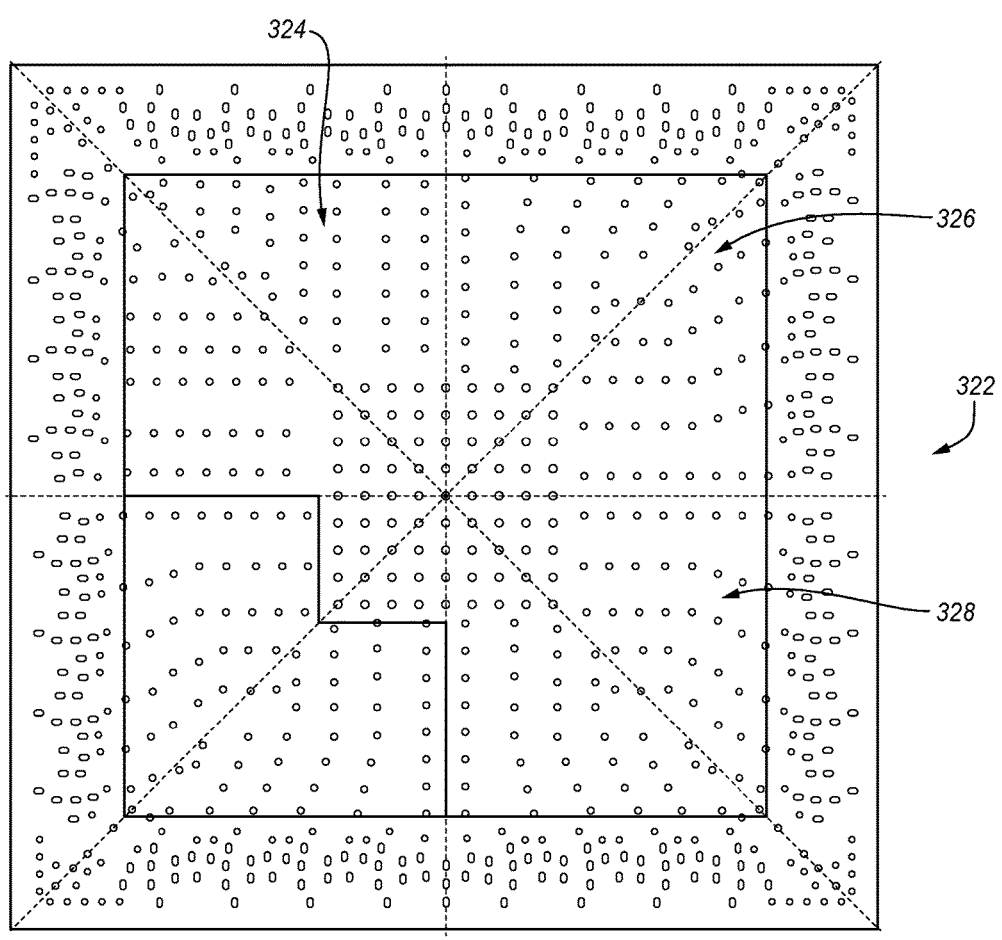
FIG. 9 is a diagram of a top view of a chip attachment area in which one of four quadrants has a radial star ball pattern according to an embodiment.

In FIG. 9, a chip attachment area 322 has three gridded pattern quadrants 324, 326, 328. The particular positioning of the gridded area relative to the radial star area may be adapted to suit different implementations. In addition while a gridded pattern is shown with straight, even, orthogonal rows and columns, other types of patterns may be mixed with the radial star pattern. The description herein is presented in the context of quadrants. This is a common way of laying out connections in a chip attachment area. However, the area may be divided into halves, thirds, fifths, etc. The areas may be another shape other than square. The square blocks with diagonals is suitable for many applications but other shapes and dividers at other angles may be used to lay out the radial star ball pattern.

While the chip attachment area has been presented in the figures as being a portion of a motherboard or socket, the chip will have a matching pattern so that the lands or pads of the motherboard are able to connect to the lands or pads of the chip. Any of the L1 diagram patterns, such as those of FIGS. 3, 7, 8, and 9 also show the pattern that will be formed on the chip in order to connect to the pattern on the board or socket. The chip substrate is typically made of a higher quality material than the motherboard, in which case the spacing limitations of the motherboard will still determine the minimum spacing between vias and traces as described above.

Figure 10:
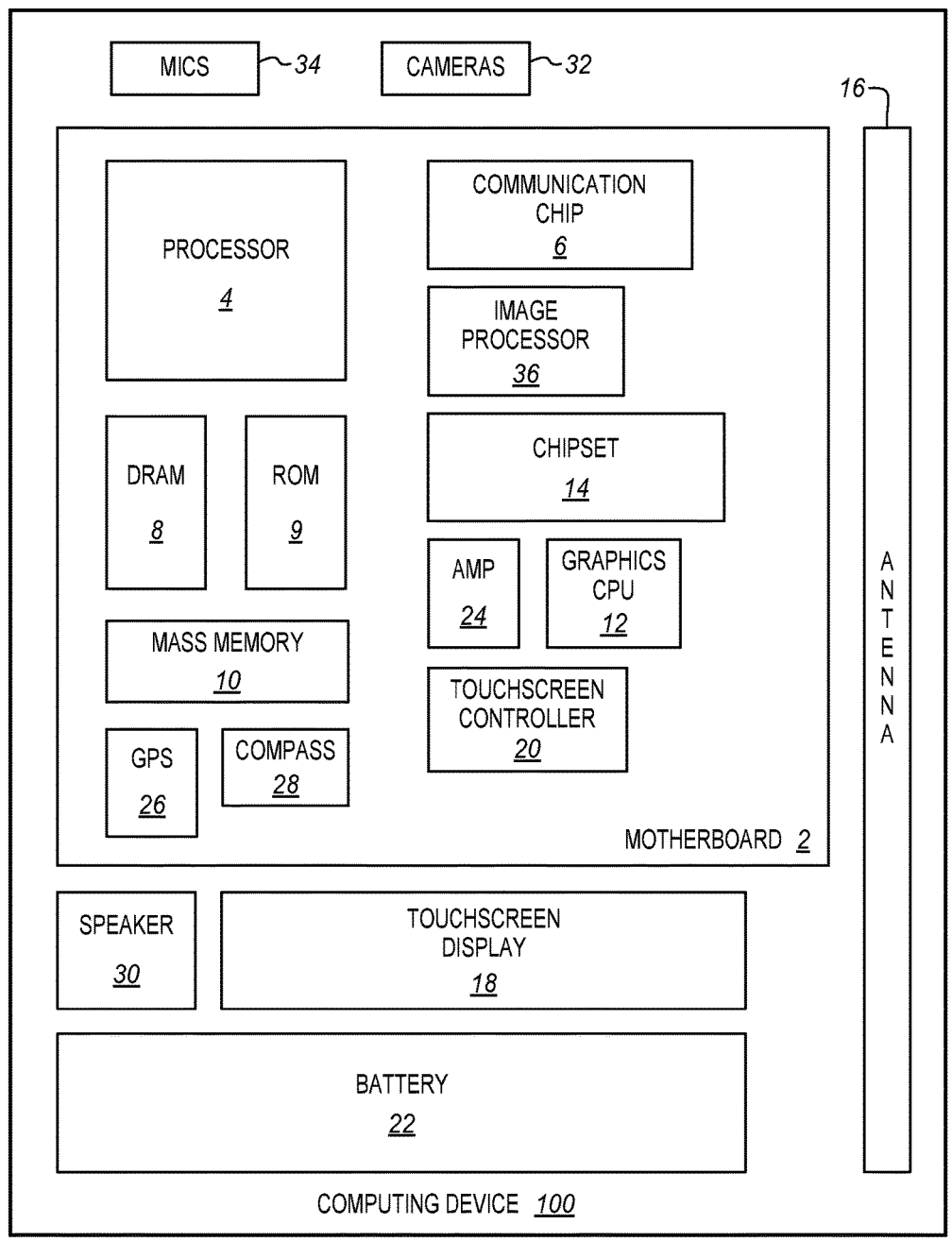
FIG. 10 is a block diagram of a computing device suitable for use with embodiments.

FIG. 10 illustrates a computing device 100 in accordance with an embodiment. The computing device 100 houses a board 2. The board 2 may include a number of components, including but not limited to a processor 4 and at least one communication chip 6. The processor 4 is physically and electrically coupled to the board 2. In some implementations the at least one communication chip 6 is also physically and electrically coupled to the board 2. In further implementations, the communication chip 6 is part of the processor 4.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication chip 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication chips 6. For instance, a first communication chip 6 may be dedicated to shorter range wireless communications such as Wi-Fi and Bluetooth and a second communication chip 6 may be dedicated to longer range wireless communications such as GPS, EDGE, GPRS, CDMA, WiMAX, LTE, Ev-DO, and others.

The processor 4 of the computing device 100 includes an integrated circuit die packaged within the processor 4. In some implementations, the packages that include the processor, memory devices, communication devices, or other components may have a radial star ball pattern to match a similar radial star ball pattern of a chip attachment area of the board. The term "processor" may refer to any device or portion of a device that processes electronic data from registers and/or memory to transform that electronic data into other electronic data that may be stored in registers and/or memory.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 100 may be any other electronic device that processes data.

Embodiments may be adapted to be used with a variety of different types of packages for different implementations. References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, the specific location of elements as shown and described herein may be changed and are not limited to what is shown. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a printed circuit board that includes a central power connector area having a plurality of power connectors to provide power to an attached chip, a signal area having a plurality of signal connectors to communicate signals to the attached chip, an edge area surrounding the signal area and the central power connector area, and a plurality of traces each coupled to a signal connector, the traces extending from the respective coupled signal connector away from the central power connector to connect to an external component, wherein the signal connectors are placed in rows, the rows having a greater separation near the edge area than near the central area.

In further embodiments the separation of the rows near the edge area is greater than a number of traces between adjacent rows multiplied by a width of each trace and a minimum trace spacing.

In further embodiments the rows diverge away from a first row with distance from the central area.

In further embodiments at least some of the rows diverge from the first row along a straight diagonal.

In further embodiments a second row has connectors that are shifted away from an adjacent first row to accommodate a trace between the first row and the second row.

In further embodiments the first row is straight and the second row curves away from the first row.

In further embodiments the curved rows include power connectors without traces to provide power to the attached chip.

In further embodiments the traces are formed on a layer of the board below the signal connectors.

In further embodiments the power connectors include vias through the board to a layer of the board below the power connectors In further embodiments the signal connectors comprise lands.

In further embodiments the signal connectors comprise solder balls.

Further embodiments include the attached chip having a plurality of connection lands aligned to connect to the power connectors and the signal connectors.

Some embodiment pertain to a method that includes laying out a first row of signal connectors to communicate signals to an attached chip in a signal area of a printed circuit board between a central power connector area, having a plurality of power connectors to provide power to an attached chip, and an edge area surrounding the signal area and the central power connector area, the first row extending along a straight line in the signal area from the central power connector area to the edge area, laying out a plurality of traces, each coupled to a signal connector of the first row, the traces extending from the respective coupled signal connector away from the central power connector to connect to an external component, and laying out a second row of signal connectors, the second row having a greater separation from the first row near the edge area than near the central area.

In further embodiments laying out a second row comprises laying out a separation of the second row that is greater near the edge area than a number of traces between the first row and the second row multiplied by a width of each trace and a minimum trace spacing.

In further embodiments the second row has connectors that are shifted away from the first row to accommodate a trace between the first row and the second row.

In further embodiments the signal area is rectangular having four sides, each side having a quadrant line extending from the center of the attachment area to a middle of a respective side, and wherein the first row is laid out along a quadrant line and the second row is laid out along the first row on a side opposite a quadrant line.

In further embodiments each quadrant is divided by a diagonal line from the center of the attachment area to a corner of the edge area of the rectangular signal area, the method further comprising laying out additional rows to the diagonal.

Some embodiments pertain to a computing system that includes a processor, a memory, and a printed circuit board connected to the processor to the memory to couple the processor to the memory, the printed circuit board having a central power connector area having a plurality of power connectors to provide power to the processor, a signal area having a plurality of signal connectors to communicate signals to the processor, an edge area surrounding the signal area and the central power connector area, and a plurality of traces each coupled to a signal connector, the traces extending from the respective coupled signal connector away from the central power connector to connect to an external component, wherein the signal connectors are placed in rows, the rows having a greater separation near the edge area than near the central area.

In further embodiments the separation of the rows near the edge area is greater than a number of traces between adjacent rows multiplied by a width of each trace and a minimum trace spacing.

In further embodiments a second row has connectors that are shifted away from an adjacent first row to accommodate a trace between the first row and the second row.

What is claimed is:

1. A printed circuit board comprising:
   a central power connector area having a plurality of power connectors to provide power to an attached chip;
   a signal area having a plurality of signal connectors to communicate signals to the attached chip;
   an edge area surrounding the signal area and the central power connector area; and
   a plurality of traces each coupled to a signal connector, the traces extending from the respective coupled signal connector away from the central power connector to connect to an external component, wherein the signal connectors are placed in rows, the rows having a greater separation near the edge area than near the central area, and wherein a second row diverges away from an adjacent first row with distance from the central area.

2. The board of claim 1, wherein the separation of the rows near the edge area is greater than a number of traces between adjacent rows multiplied by a width of each trace and a minimum trace spacing.

3. The board of claim 1, wherein at least some of the rows diverge from the first row along a straight diagonal.

4. The board of claim 1, wherein a second row has connectors that are shifted away from the adjacent first row to accommodate a trace between the first row and the second row.

5. The board of claim 4 wherein the first row is straight and the second row curves away from the first row.

6. The board of claim 5, wherein the second row includes power connectors without traces to provide power to the attached chip.

7. The board of claim 1, wherein the traces are formed on a layer of the board below the signal connectors.

8. The board of claim 1, wherein the power connectors include vias through the board to a layer of the board below the power connectors.

9. The board of claim 1, wherein the signal connectors comprise lands.

10. The board of claim 1, wherein the signal connectors comprise solder balls.

11. The board of claim 1, further comprising the attached chip having a plurality of connection lands aligned to connect to the power connectors and the signal connectors.

12. A computing system comprising:
    a processor;
    a memory; and
    a printed circuit board connected to the processor to the memory to couple the processor to the memory, the printed circuit board having a central power connector area having a plurality of power connectors to provide power to the processor, a signal area having a plurality of signal connectors to communicate signals to the processor, an edge area surrounding the signal area and the central power connector area, and a plurality of traces each coupled to a signal connector, the traces extending from the respective coupled signal connector away from the central power connector to connect to an external component, wherein the signal connectors are placed in rows, the rows having a greater separation near the edge area than near the central area, and wherein a second row diverges away from an adjacent first row with distance from the central area.

13. The system of claim 12, wherein the separation of the rows near the edge area is greater than a number of traces between adjacent rows multiplied by a width of each trace and a minimum trace spacing.

14. The system of claim 12, wherein the second row has connectors that are shifted away from the adjacent first row to accommodate a trace between the first row and the second row.

* * * * *